(12) United States Patent
Nielson et al.

(10) Patent No.: US 9,112,100 B2
(45) Date of Patent: Aug. 18, 2015

(54) METHOD FOR FABRICATING PIXELATED SILICON DEVICE CELLS

(71) Applicant: Sandia Corporation, Albuquerque, NM (US)

(72) Inventors: Gregory N. Nielson, Albuquerque, NM (US); Murat Okandan, Edgewood, NM (US); Jose Luis Cruz-Campa, Albuquerque, NM (US); Jeffrey S. Nelson, Albuquerque, NM (US); Benjamin John Anderson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/158,931

(22) Filed: Jan. 20, 2014

(65) Prior Publication Data

US 2015/0207023 A1 Jul. 23, 2015

(51) Int. Cl.
*H01L 31/0352* (2006.01)
*H01L 31/18* (2006.01)

(52) U.S. Cl.
CPC ........ *H01L 31/1876* (2013.01); *H01L 31/1804* (2013.01); *H01L 31/1896* (2013.01)

(58) Field of Classification Search
CPC .................... H01L 31/0352; H01L 31/022425
USPC ....................................... 136/256; 438/97, 98
See application file for complete search history.

(56) References Cited

U.S. PATENT DOCUMENTS

2013/0291940 A1* 11/2013 Manning ....................... 136/256

* cited by examiner

*Primary Examiner* — Selim Ahmed
*Assistant Examiner* — Changhyun Yi
(74) *Attorney, Agent, or Firm* — Martin I. Finston

(57) ABSTRACT

A method, apparatus and system for flexible, ultra-thin, and high efficiency pixelated silicon or other semiconductor photovoltaic solar cell array fabrication is disclosed. A structure and method of creation for a pixelated silicon or other semiconductor photovoltaic solar cell array with interconnects is described using a manufacturing method that is simplified compared to previous versions of pixelated silicon photovoltaic cells that require more microfabrication steps.

13 Claims, 7 Drawing Sheets

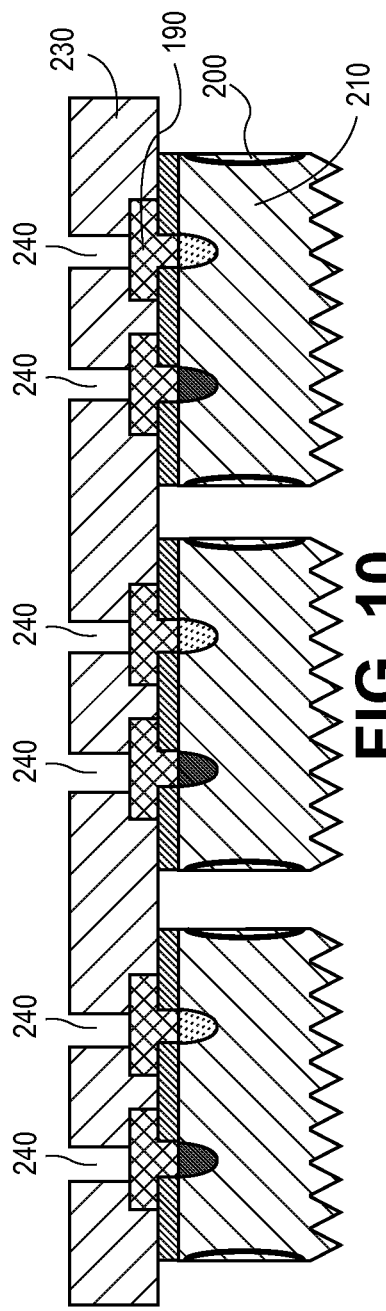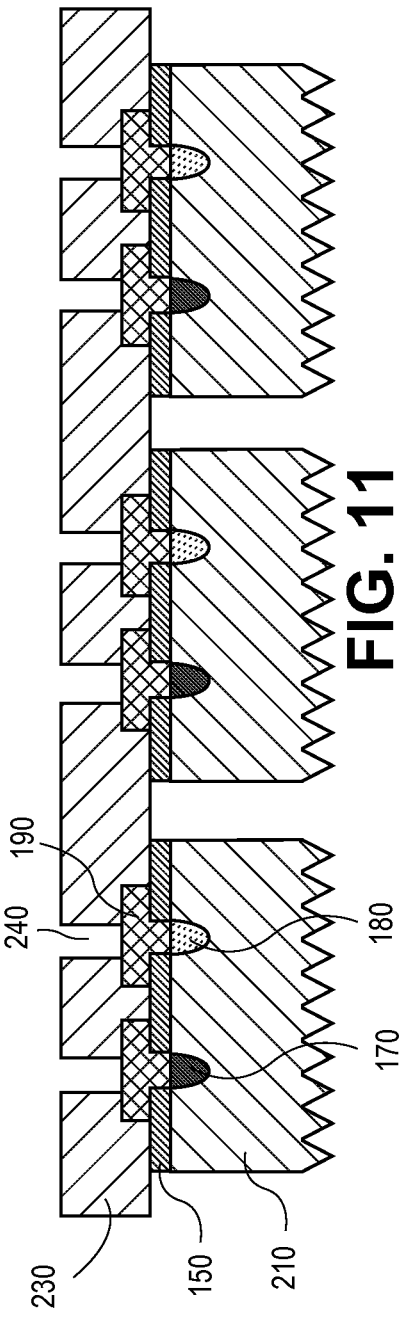

METHOD FOR FABRICATING PIXELATED SILICON DEVICE CELLS

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

Pixelated silicon cells or integrated circuits.

BACKGROUND

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. This generally entails reducing the costs associated with photovoltaic solar cell fabrication.

One way to reduce costs is to reduce a size of the photovoltaic solar cells. In this aspect, small and thin photovoltaic cells have been developed that reduce photovoltaic material use dramatically. These thin photovoltaic cells are typically formed on top of a handle wafer. Once formed, the cells may be individually detached from the handle wafer by, for example, an etching process using a hydrofluoric acid (HF) solution to undercut the cells. These "free floating" cells may then be assembled into sheets by attracting the individual cells to a desired position on a sheet of material using self-assembly techniques. Finally, the cells may be embedded in a low-cost substrate with, for example, contacts and microlenses to form photovoltaic sheets.

SUMMARY

A method, apparatus and system for flexible, ultra-thin, and high efficiency pixelated silicon or other semiconductor photovoltaic solar cell array fabrication is disclosed. A structure and method of creation for a pixelated silicon or other semiconductor photovoltaic solar cell array with interconnects is described using a manufacturing method that is simplified compared to previous versions of pixelated silicon photovoltaic cells that require more microfabrication steps. A method to create interconnected arrays of cells or integrated circuits with a stealth dicing operation used in a unique manner, a die saw, or a deep reactive ion etch (DRIE) for pixelating the die is also described. A structure operable for creating pixelated arrays of cells or integrated circuits using a germanium layer for either wet chemical (etch) release or for a laser lift-off approach when combined with silicon handle and device layers is further described. These techniques can be used to create either dense arrays of nearly 100% fill factor or sparse arrays of silicon cells or integrated circuits. The methods and structures described provide significant advantages over existing technologies for flexible or concentrated photovoltaic modules as well as for various applications of flexible electronics.

BRIEF DESCRIPTION OF THE DRAWINGS

The invention may best be understood by referring to the following description and accompanying drawings that are used to illustrate embodiments of the invention. The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings:

FIG. 10 schematically illustrates a cross-sectional view of one embodiment of openings formed on a polymer layer.

FIG. 11 schematically illustrates a cross-sectional view of one embodiment of where damaged semiconductor material has been removed.

DETAILED DESCRIPTION

In this section we shall explain several preferred embodiments of this invention with reference to the appended drawings. Whenever the shapes, relative positions, and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
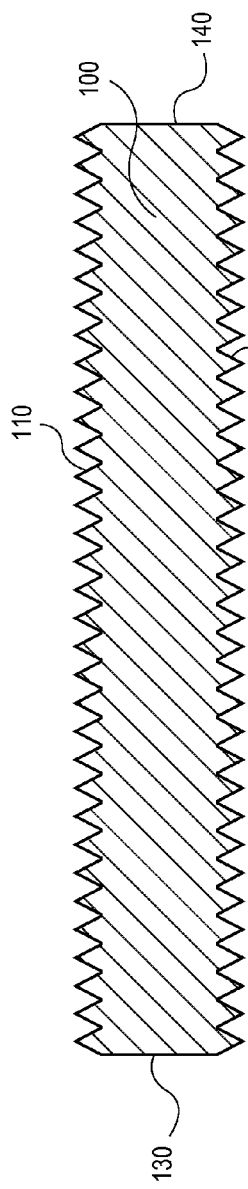
FIG. 1 schematically illustrates a cross-sectional view of one embodiment of a device layer.

FIG. 1 schematically illustrates a cross-sectional view of one embodiment of a device layer. Representatively, according to one embodiment, a manufacturing method begins with an unpolished device layer 100 having a first side 110, second side 120, and opposing side walls 130 and 140. For forming a device or cell array, device layer may be made of any semiconductor material suitable for forming devices therefrom. Device layer may be mono-crystalline. Device layer may be made of a silicon material or other types of semiconductor materials including, but not limited to III-V compound semiconductors (e.g., gallium arsenide, indium phosphide, indium gallium arsenide, etc.). Devices that may be made from device layer may include, but are not limited to, detectors, sensors, photovoltaic (PV) cells, integrated circuits (IC), micro-machine parts, micro-mechanical parts, electronic components, a combination of any of the above, or other devices specific for a desired use. In one embodiment, the thickness of the device layer is approximately between 5-500 microns.

Figure 2:
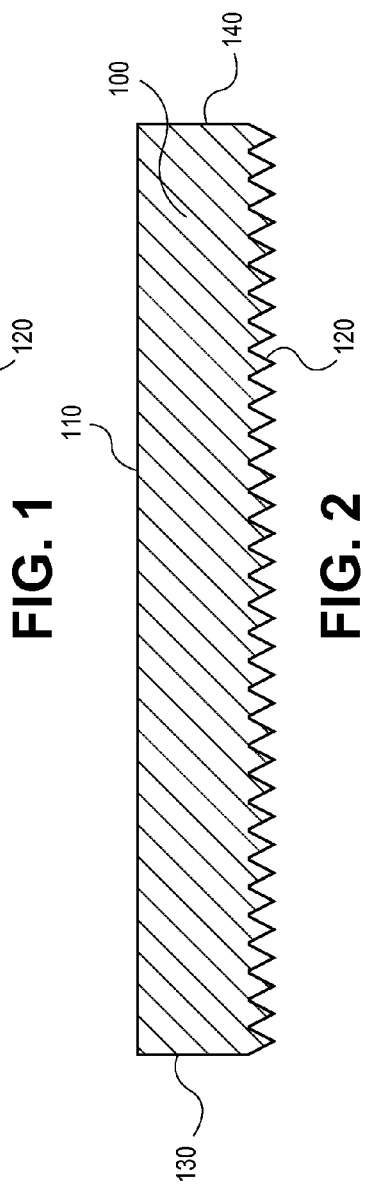
FIG. 2 schematically illustrates a cross-sectional view of one embodiment of a device layer with a first side polished smooth.
Figure 3:
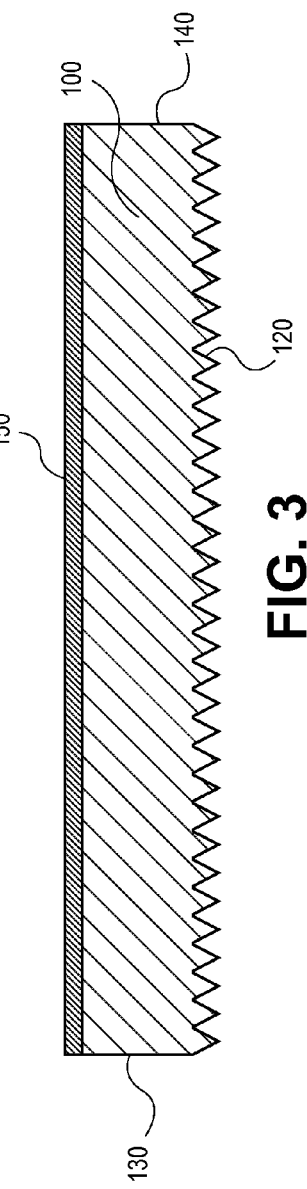
FIG. 3 schematically illustrates a cross-sectional view of one embodiment of a device layer with a dielectric layer deposited or grown on the first side of the device layer.
Figure 4:
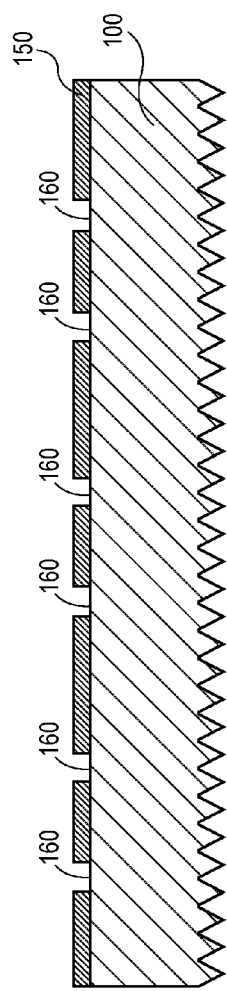
FIG. 4 schematically illustrates a cross-sectional view of one embodiment of a device layer with openings formed on a dielectric layer.
Figure 5:
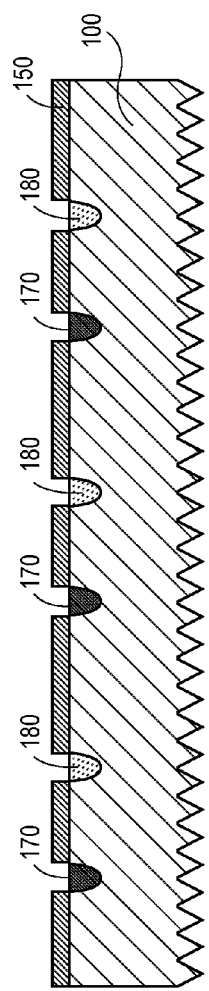
FIG. 5 schematically illustrates a cross-sectional view of one embodiment of a device layer with n-type and p-type doped regions.

FIG. 2 schematically illustrates a cross-sectional view of one embodiment wherein a first side 110 of the device layer 100 is polished so that the surface is smooth and any saw damage is preferably removed. FIG. 3 schematically illustrates one embodiment wherein a dielectric layer 150 is deposited or grown onto the polished first side 110 of the device layer 100. In one embodiment, dielectric layer 150 may provide passivation to the device layer. In one embodiment, the deposition of the dielectric layer 150 is grown or deposited. For example, if a device layer 100 is silicon and a dielectric layer 150 is $SiO_2$, then the dielectric layer 150 is grown. FIG. 4 illustrates openings 160 in the dielectric layer 150 are formed so that the device layer 100 is exposed, thereby allowing for dopants to be diffused or implanted into the device layer 100 through the holes 160. The holes or openings may be created through a photolithograph and etch process. Other approaches to implanting/diffusion dopants are also possible which may not require the opening of holes to allow access to the semiconductor surface. As shown in FIG. 5, once openings 160 are created, junction regions may be formed in device layer 100, by introducing n-type 170 and p-type 180 dopants. In one embodiment, n 170 and p 180 dopants may be screen-printed and annealed, or laser doped onto the device layer 100, so that n 170 and p 180 regions are alternating. It is also possible to diffuse or implant the dopants before the dielectric layer 150 is deposited onto the device layer 100. Suitable dopants for the p-type 180 doped region may include, but are not limited to, boron, aluminum, or gallium as the dopant. Suitable dopants for the n-type 170 doped region may include, but are not limited to, phosphorus and arsenic.

Figure 6:
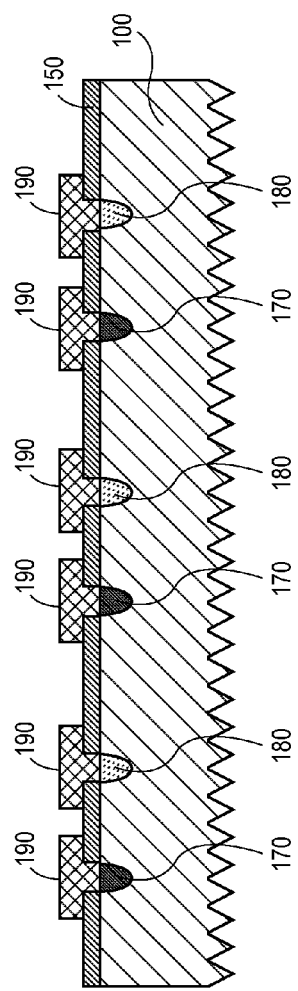
FIG. 6 schematically illustrates a cross-sectional view of one embodiment of a device layer with metal contacts.

As shown in FIG. 6, the doped regions are metallized through the n-doped 170 and p-doped 180 openings 160 or holes 160 in the dielectric layer 150 so that metal contacts 190 are formed to the junction regions. In one embodiment, metallization occurs through screen printing and followed by annealing. For example, aluminum, silver, copper and the like may be used to form metal contacts 190 at the n 170 and p 180 doped regions. One or more layers or stacks of dielectric layers 150 and metal contacts 190 may occur.

Figure 7:
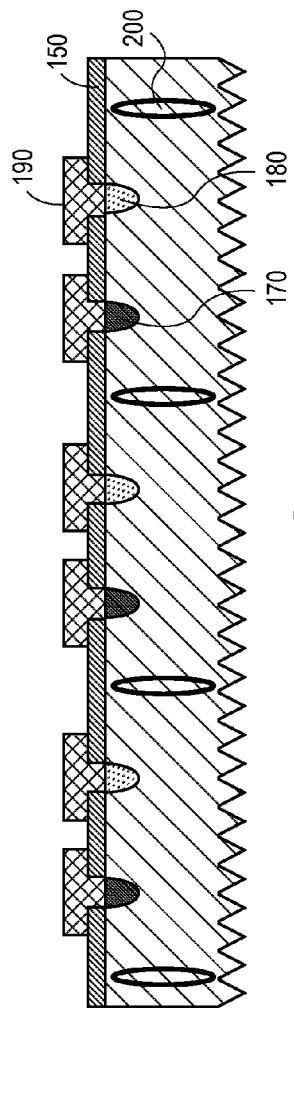
FIG. 7 schematically illustrates a cross-sectional view of one embodiment of a device layer with damage induced within the device layer.
Figure 8:
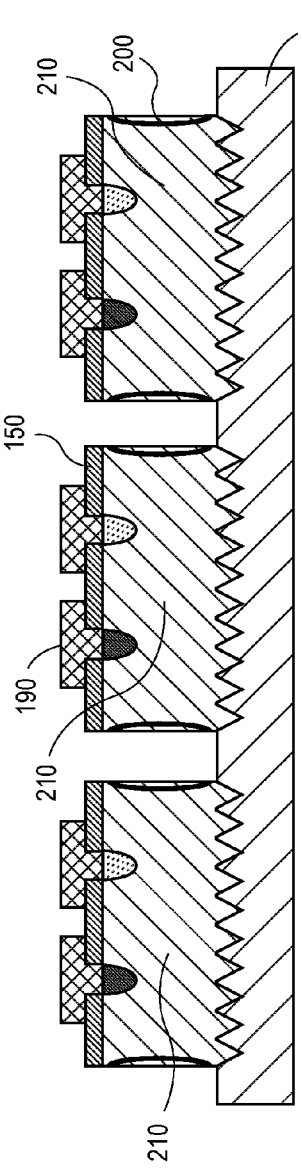
FIG. 8 schematically illustrates a cross-sectional view of one embodiment of a device layer broken into device cells with a tape or film attached.

As shown in FIGS. 7 and 8, once the metal contacts 190 have been formed, device layer may be divided into cells 210. For a device layer 100 of silicon, silicon damage 200 of device layer 100 is induced in the device layer 100 through stealth dicing, die saw, scribe, or laser ablation. In one embodiment, stealth dicing is used to induce damage 200 in the device layer 100. For example, where the device layer 100 is made of silicon, electromagnetic radiation that is at or below the band gap of silicon, is focused onto the silicon device layer 100 at the desired location. Since the light is below the bandgap, the light is not absorbed until it is tightly focused within the silicon. When the light becomes very intense at the focal point of the light within the silicon, multi-photon absorption events begin occurring which then heats up the silicon locally and causes damage in the crystalline structure of the silicon device layer 100 at the desired regions 200. A die saw or laser ablation may also be used to induce damage 200 in the device layer 100 but this damage would be initiated at the surface of the silicon rather than within the bulk silicon such as with stealth dicing. A further alternative to dividing the silicon into individual cells is the use of deep reactive ion etching (DRIE) or, for very thin layers of silicon (<10-15 microns) reactive ion etching (RIE). Under some circumstances, such as device layer thicknesses below approximately 5 microns, wet or gas-phase etching may also be used. This would involve the use a lithography step to define an etch mask on the silicon but may have other useful advantages as compared to stealth dicing, die sawing, or laser ablation.

As shown in FIGS. 7 and 8, once the device layer 100 has been damaged at the desired regions 200, tape or film 220 is attached on the second side 120 of the device layer 100 (opposite of the side with metal contacts 190). The tape or film 220 is spread apart, causing the device layer 100 to break apart at the damaged or weakened regions 200 into individual device cells 210, while remaining attached to the tape or film 220. In one embodiment, a gap between adjacent cells 210 after spreading may be approximately 5-100 microns. In one embodiment, it is preferred to have gaps that are less than 50 microns apart between the device cells 210. The tape or film 220 may be manipulated to contract, thereby reducing the gaps to the preferred distance of approximately 5-25 microns between the device cells 210. This reduced gap is preferred because the cells 210 are assembled, for example, into a photovoltaic array, the reduced gap allows for collection of more light while maintaining the desired flexibility. However, the desired gap between the device cells 210 may vary, depending on the thickness of the device cells 210. In general, the thicker the device cell 210, the greater the gap required to maintain the same flexibility. The DRIE or RIE singulation methods would not require the tape or film spreading to break cells apart. For these techniques, the gap between the cells would be set by the dimensions etched which result from the lithographically defined etch mask created on the silicon wafer.

Figure 9:
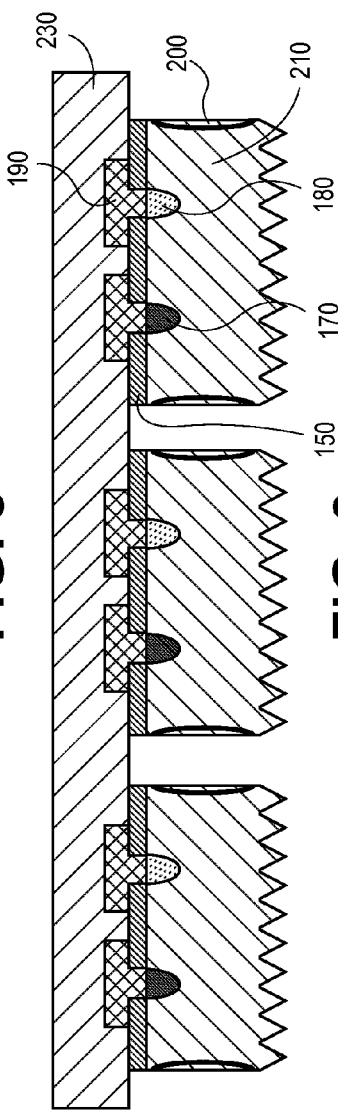
FIG. 9 schematically illustrates a cross-sectional view of one embodiment of a device cells transferred to a polymer layer.

As shown in FIG. 9, while the device cells 210 remain attached to the tape or film 220, a polymer layer 230 is transferred onto the first side 110 of the device layer 100 (or the equivalent surface for device cells 210) so that the metal contacts 190 and dielectric layer 150 are attached to the polymer layer 230. In one embodiment, the polymer layer 230 is a polymer selected from a group of polyimide, polyester, polyurethane, polychlorotrifluoroethylene, Kapton, Tedlar, DURApro, polyvinyl fluoride, polyvinyl chloride, polytetrafluoroethylene, polyvinylidene fluoride, and polydimethylsiloxane, which may be solid or liquid. In one embodiment, a thickness of the polymer layer 230 is 5-200 microns. In one embodiment, it is preferred that the polymer layer 230 is bonded to the device cells 210 by using an adhesive that can withstand temperatures up to 300-350° C. Once the device cells 210 have been transferred onto the polymer layer 230, the tape or film 220 is removed. The tape or film 220 may be removed by using ultraviolet light, wet etchants, or heat.

As shown in FIG. 10, the polymer layer 230 is then opened to expose the metal contacts 190. This may be accomplished by etching, laser ablating, or photo defining openings 240 in the polymer layer 230 to expose the metal contacts 190. Then, as shown in FIG. 11, excess saw, laser, or etch damage 200 may be removed through a liquid (wet) or gas phase etch, or the like. Wet-etching may be accomplished by the use of trimethylanilinium hydroxide or potassium hydroxide. Gas-etching may be performed through the use of $XeF_2$ to etch away excess damage.

Figure 12:
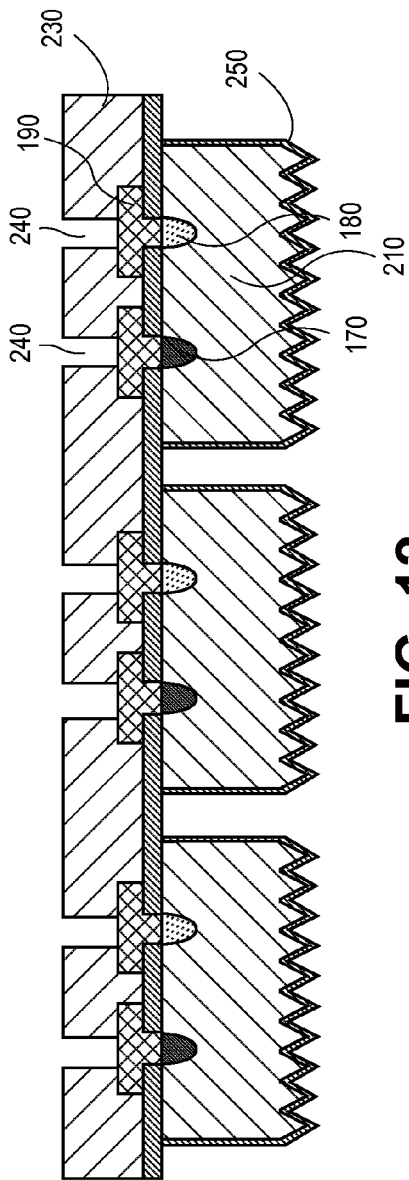
FIG. 12 schematically illustrates a cross-sectional view of one embodiment of a dielectric or passivation layer formed around the device cells.

As shown in FIG. 12, once the metal contacts 190 have been exposed through the damaged areas 240 of the polymer layer 230 and saw damage 200 have been removed, a passivation layer 250 is deposited or grown on the second side 120 of the device layer, around the device cells 210. Conformal deposition or atomic layer deposition (ALD) may be used. It may be preferable to use a second passivation layer 250 that has antireflective properties. The passivation layer 250 may be a nitride layer. In another embodiment, low temperature passivating techniques, such as atomic layer deposition (or otherwise deposited) alumina (which can be formed in between approximately 200-300° C.) or amorphous silicon, are used as materials for the passivation layer 250.

In one embodiment, a second side 120 of a device layer 100 is rough so that the surface is less reflective and scatters light within the cell, increasing the surface incidence angles, thus leading to light trapping within the cell by total internal reflection. In addition, a second passivation layer 250 with anti-reflective properties may be used to help reduce light reflection away from the device cells 210. This is important because, in embodiments where the device cell 210 has photovoltaic properties, for example, a solar cell, it is desirable for light contacting the solar cell to enter the device and not be reflected away. A dielectric layer 150 or passivation layer 250 may be made of material that is transparent to the wavelength of light of interest. The thickness and index of the passivation layer 250 are selected to use optical interference effects to force light into the cell rather than be reflected by it. The passivation/anti-reflection layer 250 may be comprised of a single material. Silicon nitride is a commonly used anti-reflection and passivation material for silicon solar cells. The passivation/anti-reflection layer 250 can also be a multi-layer stack such as a thin amorphous silicon layer for passivation followed by a silicon nitride layer to provide anti-reflection capability. The passivation/anti-reflection layers 250 can be deposited by a variety of means such as sputtering, atomic layer deposition, electron beam evaporation, chemical vapor deposition, wet chemical reactions, thermal material growth, and others.

Figure 13:
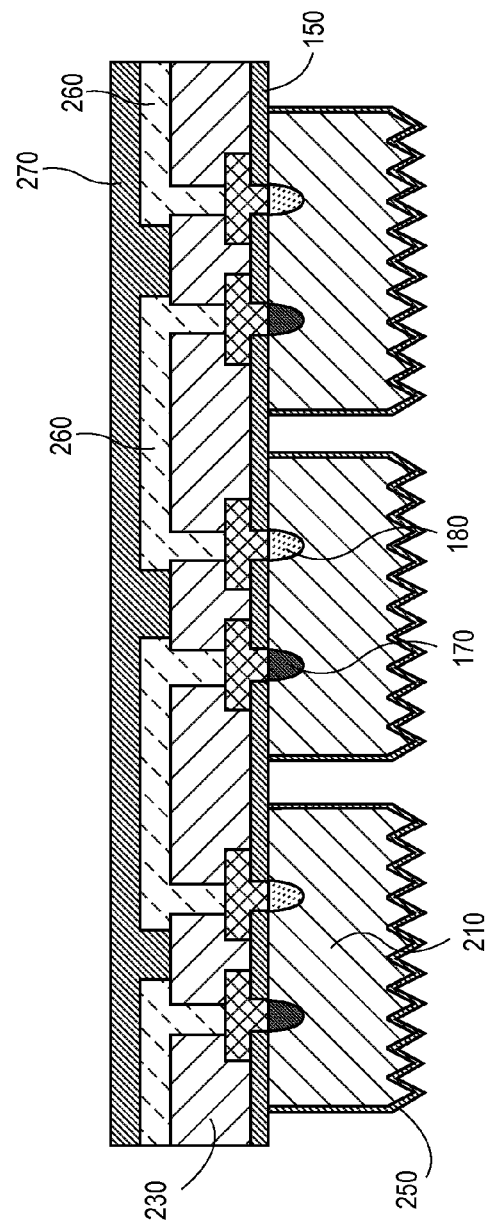
FIG. 13 schematically illustrates a cross-sectional view of one embodiment of conductive elements formed within openings of a polymer layer.

As shown in FIG. 13, after the second passivation layer 250 is deposited, in one embodiment, conductive elements 260 are implanted into the openings 240 in the polymer layer 230 so that the metal contacts 190 are interconnected. In one embodiment, conductive elements 260 may be screen printed. The conductive elements 260 may be conductive epoxy, solder, and the like.

In another embodiment, a polymer layer 230 may already have conductive elements 260 implanted onto the polymer layer 230 before the polymer layer 230 is transferred to the device cells 210 or a portion of the conductive elements 260 can be created before transferring polymer layer 230 to the device cells 210 with the final portions of the conductive elements 260 put into place subsequently. This embodiment may be more cost-effective in that it further simplifies the process.

In another embodiment, a passivation layer 270 may be deposited onto the exposed conductive elements 260 and polymer layer 230. The passivation layer 270 could be comprised of dielectric materials, semiconductor materials, and the like. It may be formed by spin coating, spray coating, sputtering, or chemical vapor deposition. FIG. 13 shows the final structure that can be used, for example, as a photovoltaic array.

Figure 14:
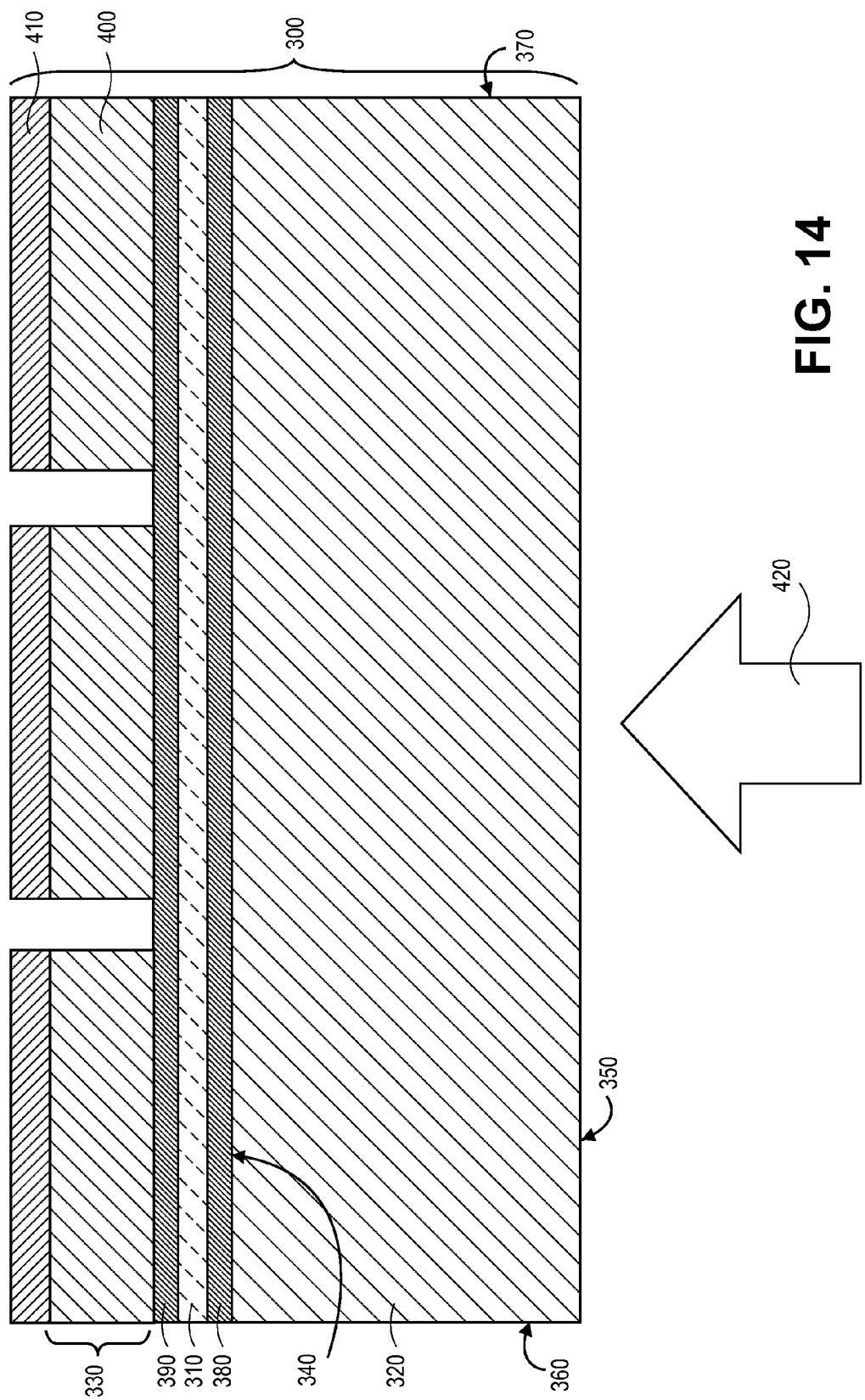
FIG. 14 schematically illustrates a cross-sectional view of one embodiment of a method for laser-lift-off of device cells from a structure.

As shown in FIG. 14, a structure 300 used for creating pixelated arrays of cells or integrated circuits using a germanium layer 310 for either wet chemical (etch) release or for a laser lift-off approach when combined with silicon handle wafer 320 and device layer 330. The structure may comprise silicon handle wafer 320 with a first side 340, second side 350 and opposing side walls 360 and 370. The handle wafer 320 is preferably between 500-800 microns thick. Handle wafer 320 effectively increases the thickness of device layer 330 to a thickness suitable for use with conventional IC and microsystem fabrication techniques. In one embodiment, handle wafer 320 is made of silicon or any silicon-based materials. It is appreciated that handle wafer 320 can be single crystalline or polycrystalline silicon.

On the first side 340 of the silicon handle wafer 320 there exists a first dielectric layer 380. The first dielectric layer 380 may be any suitable oxide, nitride, or combination thereof. The first dielectric layer 380 is preferably 0.1-5 microns thick. The first dielectric layer 380 may also not exist. On top of the first dielectric layer 380 is a germanium layer 310, which may be crystalline, poly-crystalline, or amorphous. In one embodiment, the germanium layer 310 is preferably 0.1-5 microns thick. On top of the germanium layer 310 is a second dielectric layer 390 that may be any suitable oxide, nitride, or combination thereof. In one embodiment, the second dielectric layer 390 may be 100 nm thick. In another embodiment, the second dielectric layer 390 may not exist. On top of the second dielectric layer 390 are device cells 400. The device cells or die 400 may be made of silicon. On top of each device cell 400 is a layer of metallized contacts 410 which in many instances would have electrically isolated regions defined in the metal layer (not indicated in FIG. 14). An etch method suitable for etching device layer 330 is applied to singulate the device cells 400 (e.g., Reactive Ion Etching (RIE) or Deep Reactive Ion Etching (DRIE)).

In one embodiment, individual device cells 400 may be released from the handle wafer 320 by directing electromagnetic radiation 420 from the second side 350 of the handle wafer 320, through the handle wafer 320 at the location of each device cell. In one embodiment, the electromagnetic radiation 420 has a wavelength selective for removing the germanium 310 relative to the silicon device cell 400 and the silicon handle wafer 320. Where the handle wafer 320 is silicon, the preferred wavelength of the electromagnetic radiation 420 is between 1100-1600 nanometers. This wavelength range is desirable due to the fact that these wavelengths are transparent to silicon but are absorbed by germanium. The electromagnetic radiation 420 is directed through the silicon handle wafer 320 into a germanium layer 310 near the location of the device cell 400. The light is absorbed by the germanium layer 310 and, if the light intensity is high enough, the germanium layer heats up and is converted to a plasma, thereby releasing the targeted device cell 400. A single device cell 400 can be selectively targeted for release. It is also possible to release multiple or all of the device cells 400 simultaneously. This method provides for an organized, controlled way to release the device cells 400. In another embodiment, peroxide can be used to etch away the germanium layer 310, thereby releasing the device cells 400.

Figure 15:
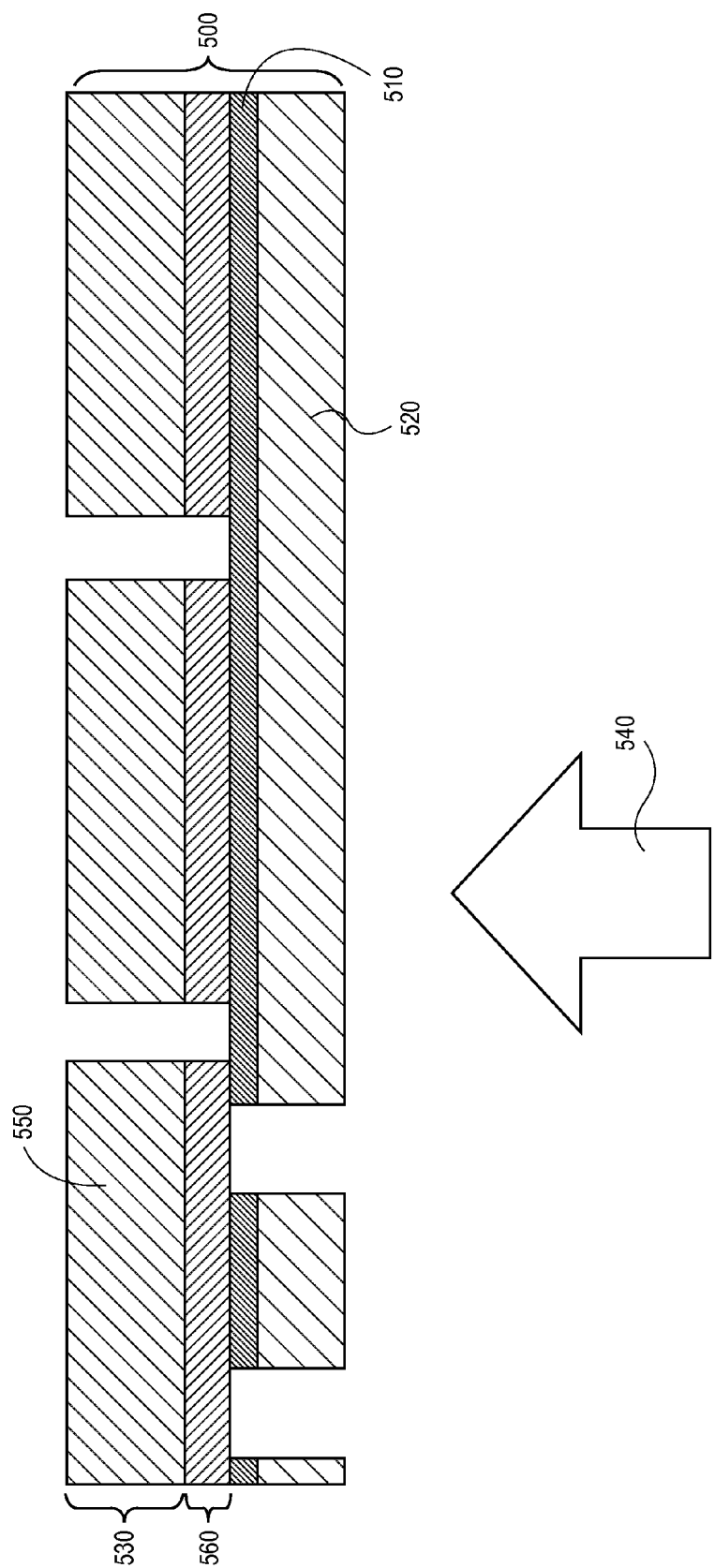
FIG. 15 schematically illustrates a cross-sectional view of one embodiment of a method for laser-lift-off of device cells from a structure.

FIG. 15 illustrates another embodiment where a method for laser-lift-off of device cells may be accomplished. A structure 500 used for creating pixelated arrays of cells or integrated circuits using an adhesive layer 510 for either wet chemical (etch) release or for a laser lift-off approach when combined with a polymer layer 520 and device layer 530 and metal contact 560. In one embodiment, a polymer layer 520 may comprise polyimide. A polymer layer 520 may be 12-50 microns thick. An adhesive layer 510 may be comprised of an adhesive epoxy layer as well as a germanium layer such that the germanium absorbs electromagnetic radiation (light) which is not absorbed by the polymer layer 520 and the adhesive epoxy portion of the adhesive layer 510. Alternatively, the adhesive layer 510 can be a single layer of an adhesive epoxy that absorbs electromagnetic radiation (light) that is not absorbed by the polymer layer 520. An adhesive layer 510 may be 1-5 microns thick. In one embodiment, the electromagnetic radiation 540 has a wavelength selective for removing the adhesive layer 510 relative to the silicon device cell 550 and the polymer layer 520. The electromagnetic radiation 540 is directed through the polymer layer 520 into an adhesive layer 510 near the location of the device cell 550. This causes the adhesive layer 510 to heat and convert to plasma, thereby releasing the targeted device cell 550. A single device cell 550 can be selectively targeted for release. It is also possible to release multiple or all of the device cells 550 simultaneously. This method provides for an organized, controlled way to release the device cells 550. Alternatively, adhesive layer 510 can be comprised of an adhesive material that is selectively removed by an etchant (gas or liquid phase) that only reacts and removes adhesive layer 510 while not reacting with any of the other materials present in the system.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated in the figure to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description, various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   (a) depositing a dielectric layer on a polished first side of a device layer;
   (b) forming openings in the dielectric layer;
   (c) doping the device layer through the openings in the dielectric layer;
   (d) metallizing the device layer through the openings in the dielectric layer;
   (e) a process that results in the device layer being broken into or singulated into device cells separate from each other with a gap in between the device cells and subsequently the device cells being attached to a polymer layer;
   (f) damaging the polymer layer to expose metal contacts; and
   (g) forming conductive elements onto the exposed metal contacts through the openings in the polymer layer so that the metal contacts are interconnected.

2. The method of claim 1, wherein the process to break or singulate the device layer into device cells separate from each other with a gap in between the device cells and the device cells being attached to a polymer layer is comprised by:
   (a) attaching a tape or film onto a second side of the device;
   (b) spreading the tape or film to break the device layer into device cells so that there exists a gap between the device cells; and
   (c) transferring the device cells onto a polymer layer.

3. The method of claim 2, wherein prior to spreading the tape or film, the method comprises damaging the device layer.

4. The method of claim 3, wherein prior to transferring the device cells onto a polymer layer, the method comprises contracting the tape or film to reduce the gap between the device cells.

5. The method of claim 4, wherein after transferring the device cells onto a polymer layer, the method comprises removing the tape or film.

6. The method of claim 5, wherein the dielectric layer is a first dielectric layer, the method further comprises depositing a second dielectric layer on the device cells.

7. The method of claim 6, wherein damaging the device layer comprises: stealth dicing, die saw, or laser ablation.

8. The method of claim 7, wherein the polymer layer comprises a polymer selected from a group of polyimide, polyester, polyurethane, polychlorotrifluoroethylene, Kapton, Tedlar, DURApro, polyvinyl fluoride, polyvinyl chloride, polytetrafluoroethylene, polyvinylidene fluoride, and polydimethylsiloxane.

9. The method of claim 2, wherein the polymer layer comprises one or more conductive elements implanted onto the polymer layer.

10. A method comprising:
    depositing a dielectric layer on a polished first side of a device layer;
    forming openings in the dielectric layer;
    doping the device layer through the openings in the dielectric layer;
    metallizing the device layer through the openings in the dielectric layer;
    attaching a polymer layer to the first side of the device layer;
    lithographically defining an etch mask onto the second side of the device layer; and
    etching the device layer into separate device cells such that a gap exists between the device cells;
    damaging the polymer layer to expose metal contacts; and
    forming conductive elements onto the exposed metal contacts through the openings in the polymer layer so that the metal contacts are interconnected.

11. The method of claim 10, wherein the dielectric layer is a first dielectric layer, the method further comprising depositing a second dielectric layer on the device cells.

12. The method of claim 10, wherein the polymer layer comprises a polymer selected from a group of polyimide, polyester, polyurethane, polychlorotrifluoroethylene, Kapton, Tedlar, DURApro, polyvinyl fluoride, polyvinyl chloride, polytetrafluoroethylene, polyvinylidene fluoride, and polydimethylsiloxane.

13. The method of claim 10, wherein the polymer layer comprises one or more conductive elements implanted onto the polymer layer.

\* \* \* \* \*